United States Patent
Panosyan et al.

(10) Patent No.: US 9,531,321 B2
(45) Date of Patent: Dec. 27, 2016

(54) SYSTEM AND METHOD OF ONLINE FILTERING OF PHOTOVOLTAIC SIGNALS

(71) Applicant: GENERAL ELECTRIC COMPANY, Schenectady, NY (US)

(72) Inventors: Ara Panosyan, Munich (DE); Luca Parolini, Munich (DE); Eva-Maria Baerthlein, Hamburg (DE); Daniel Kotzor, Seefeld (DE)

(73) Assignee: General Electric Company, Niskayuna, NY (US)

( * ) Notice: Subject to any disclaimer, the term of this patent is extended or adjusted under 35 U.S.C. 154(b) by 424 days.

(21) Appl. No.: 14/258,756

(22) Filed: Apr. 22, 2014

(65) Prior Publication Data

US 2015/0303861 A1    Oct. 22, 2015

(51) Int. Cl.
  *G05D 5/00*    (2006.01)
  *H02S 40/30*   (2014.01)
  *H01L 31/02*   (2006.01)

(52) U.S. Cl.
  CPC ......... *H02S 40/30* (2014.12); *H01L 31/02021* (2013.01); *Y02E 10/50* (2013.01)

(58) Field of Classification Search
  CPC ....................................................... H02S 40/30
  See application file for complete search history.

(56) References Cited

U.S. PATENT DOCUMENTS

| | | | | |
|---|---|---|---|---|
| 5,500,052 A | * | 3/1996 | Horiuchi | G05F 1/67 136/244 |
| 7,834,485 B2 | * | 11/2010 | Park | H02J 7/35 307/117 |
| 2011/0317460 A1 | | 12/2011 | Garces Rivera et al. | |
| 2012/0063179 A1 | | 3/2012 | Gong et al. | |
| 2012/0069602 A1 | * | 3/2012 | Escobar | G05F 1/67 363/13 |
| 2012/0223670 A1 | * | 9/2012 | Kinjo | H02J 3/32 320/103 |
| 2013/0076135 A1 | * | 3/2013 | Zhu | H02M 3/1584 307/43 |

(Continued)

FOREIGN PATENT DOCUMENTS

| | | |
|---|---|---|
| EP | 2223405 B1 | 10/2012 |
| WO | 2012155297 A1 | 11/2012 |

OTHER PUBLICATIONS

Beides et al., "Dynamic state estimation of power system harmonics using Kalman filter methodology", Power Delivery, IEEE Transactions on, pp. 1663-1670, vol. 6, Issue 4, Oct. 1991.

(Continued)

*Primary Examiner* — Philip Wang
(74) *Attorney, Agent, or Firm* — Francis T. Coppa

(57) ABSTRACT

A system for online filtering of photovoltaic (PV) output signals includes a programmable filter that is programmed to decompose measured PV output power into an estimated low-frequency signal component, based substantially on movement of the sun and an estimated high-frequency signal component, based substantially on cloud shading. An open loop controller generates a reactive power compensation signal based on at least one of the low-frequency signal component and the high-frequency signal component. The low-frequency signal component is defined by a positive portion of a sine curve that is based substantially on movement of the sun.

15 Claims, 2 Drawing Sheets

(56) References Cited

U.S. PATENT DOCUMENTS

Figure 1:
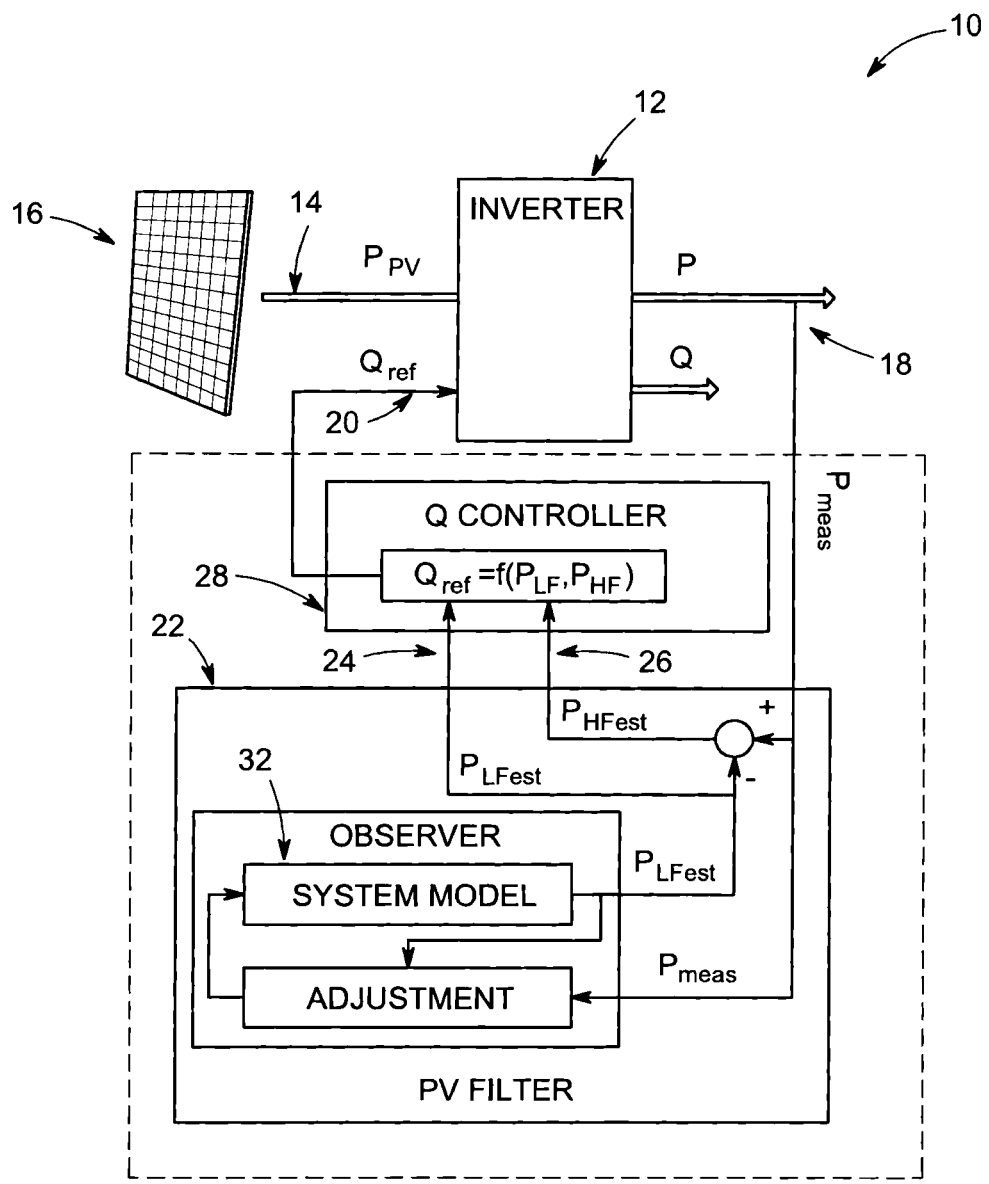

| 2013/0076150 A1* | 3/2013 | Wagoner | H02M 3/1584 |
| | | | 307/82 |
| 2015/0288319 A1* | 10/2015 | Hartman | H02S 10/40 |
| | | | 136/245 |
| 2015/0340988 A1* | 11/2015 | Shinada | H02S 40/22 |
| | | | 136/246 |

OTHER PUBLICATIONS

Soliman et al., "Application of Kalman filtering for online estimation of symmetrical components for power system protection", Electric Power Systems Research, pp. 113-123, vol. 38, Issue 2, Aug. 1996.

Pigazo et al., "Estimation of Electrical Power Quantities by Means of Kalman Filtering", Kalman Filter Recent Advances and Applications, InTech, pp. 1-23, Apr. 2009.

Scansen, "Line Filtering for Solar Power Inverters", Digi-Key Corporation, May 16, 2012.

Panosyan et al., "Reactive power Compensation of Self-Induced Voltage Variations", CIRED Workshop, pp. 1-4, May 2012.

* cited by examiner

SYSTEM AND METHOD OF ONLINE FILTERING OF PHOTOVOLTAIC SIGNALS

BACKGROUND

The subject matter of this disclosure relates generally to photovoltaic (PV) power, and more particularly, to a system and method of filtering PV signals online to provide reactive power compensation by a PV inverter.

Reactive power compensation is a measure commonly employed for indirect voltage regulation. Modern PV inverters are required to have reactive power capabilities, and can therefore provide reactive power support. One method of reactive power compensation utilizes closed-loop voltage control by the PV inverters. The closed-loop controller automatically achieves and maintains the desired set point voltage at the point of interconnection (POI). It does this by comparing the actual voltage value measured at the POI with the voltage set point value, and adjusting the reactive power output of the PV inverter to minimize the error signal, which is the difference between the measured value and the reference value. In other words, a closed-loop controller is a fully automatic control system in which the reactive power compensation by the PV inverter is a function of the difference between the set point voltage and the measured voltage at the POI. A closed-loop voltage controller however may adversely interact with other PV inverter voltage controllers and capacitor back controls, as well as with On-Load Tap Changing (OLTC) transformers and voltage regulators.

An alternative method of reactive power compensation utilizes open-loop voltage control, where the reactive power compensation by the PV inverter is a function of its active power output. The PV inverter in this instance aims at compensating only the voltage variation caused by its own active power supply, without utilizing any closed-loop voltage control. A constant power factor reactive power compensation technique provides the simplest method of implementing open-loop compensation. More complex methods with higher compensation accuracy, such as variable power factor compensation, also exist. These reactive power compensation techniques, however, usually lead to a large amount of reactive power and therefore increased network losses.

Another measure for dealing with voltage variations in distribution networks utilizes OLTC transformers and voltage regulators. OLTCs enable a direct voltage regulation and therefore have the advantage of not injecting additional reactive power into the network, which would in most cases increase the system losses and reduce the transmission capacity of the network. Dealing with voltage variations caused by PV power generation is however a challenge, due to the slow reaction time associated with OLTC voltage compensation compared to the faster variation in PV power output due to cloud movement. A further challenge is associated with the extra wear and the lifetime reduction of the mechanical tap changers due to the high variability of PV power which could dramatically increase the number of tap changing actions.

In view of the foregoing, there is a need for a method of providing reactive power compensation in a network without incurring the life reduction generally associated with OLTC due to an increased number of tap changing actions caused by fast PV power variations. Further, the method of providing reactive power compensation in a network should not incur additional network losses caused by large amounts of reactive power in the network.

BRIEF DESCRIPTION

According to one embodiment, a programmable filter for filtering of a photovoltaic (PV) output signal and calculating a reactive power reference, comprises an online filter that is programmed with a system model for deriving a low-frequency signal component of a measured PV power signal, wherein the low-frequency signal component is based substantially on movement of the sun and is defined by a positive portion of a sine curve.

According to another embodiment, a method of online filtering of photovoltaic (PV) output signals comprises:

measuring a PV output power;

generating PV output power signals in response to the measured PV output power;

deriving via a programmable filter, a low-frequency signal component of the measured PV output power signals, wherein the low-frequency signal component is based substantially on movement of the sun and is defined by a positive portion of a sine curve;

generating via a summing element, a high-frequency signal component of the measured PV output power signals from the generated PV output power signals and the derived low-frequency signal component, wherein the high-frequency signal component is based substantially on cloud shading;

generating a reactive power compensation reference signal, wherein the reactive power compensation reference signal is a function of at least one of the high-frequency component and the low-frequency component; and controlling a source of reactive output power in response to the reactive power compensation reference signal.

DRAWINGS

Figure 2:
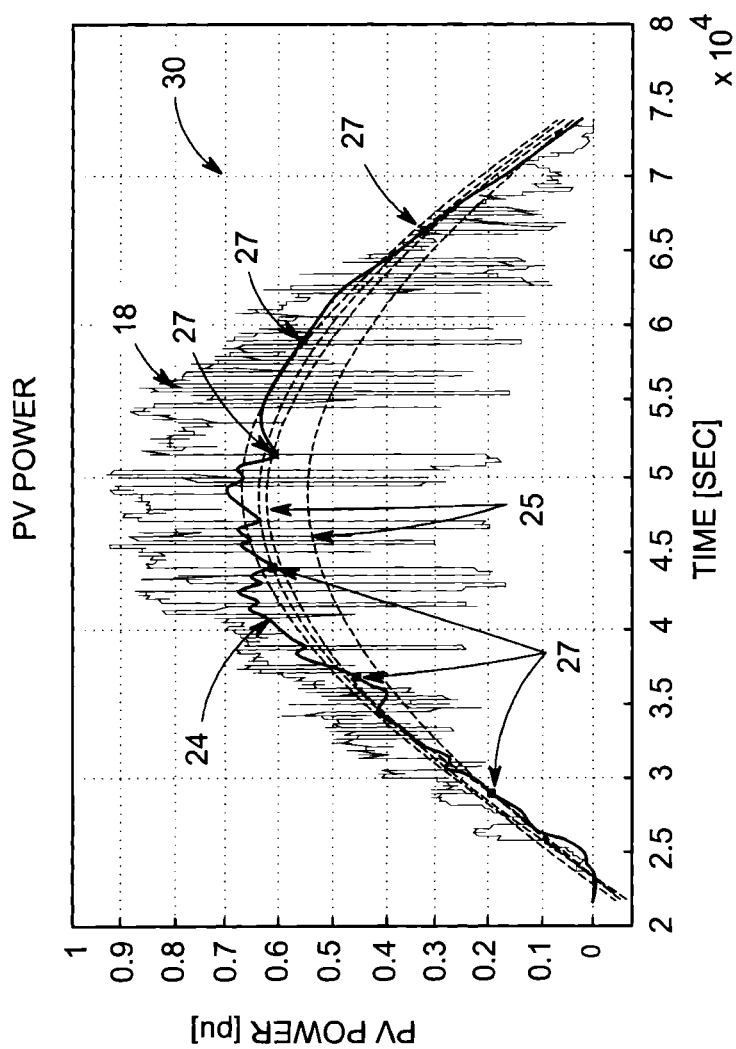

These and other features, aspects, and advantages of the present invention will become better understood when the following detailed description is read with reference to the accompanying drawings, wherein:

FIG. 1 illustrates a system for online filtering of photovoltaic (PV) output signals and computing a reactive power reference, according to one embodiment; and FIG. 2 is a graph illustrating PV power variations and a low frequency component derived by a state observer based PV filter.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Photovoltaic (PV) inverters are capable of providing dynamic reactive power support to compensate for voltage variations caused by PV variability. Inverters with reactive power capabilities need to be sized larger to handle full active and reactive currents. Further, reactive currents produce additional network losses and reduce the efficiency of the inverter. In networks with low reactance/resistance (X/R) ratios (e.g. LV cable networks), large amounts of reactive power are required for voltage compensation. This requires large reactive power capabilities (i.e. relatively larger inverters) and leads to larger increases in network and inverter losses. Ideally, dynamic reactive compensation capabilities should therefore be used for compensating the faster and smaller voltage variations, while slower but larger voltage variations could be compensated more efficiently by slower on-line-tap-changers (OLTCs) and voltage regulators.

Dividing voltage regulation between slow traditional voltage regulation devices and fast reactive power compensation devices has several advantages, including without limitation, reduced wear and tear of mechanical tap changers due to a decreased number of switching operations, smaller reactive power inverter requirements, and reduced network losses due to smaller reactive currents.

An important challenge concerns how fast and slow variations in PV power can be filtered, according to which the compensation tasks would be divided. One option is to use low-pass or high-pass filters. Such filters however, lead to large phase shifts and are therefore not suitable for online applications.

Another option is to use clear day models to estimate the clear day power output of each PV power source based on information such as time, date, location and PV module orientation. Such information would be required for each PV power source, which is not really practical, and can still result in large inaccuracies, especially on overcast days.

Keeping the foregoing issues in mind, FIG. 1 is a block diagram illustrating a system 10 for online filtering of photovoltaic (PV) output signals 14 and computing a reactive power reference, according to one embodiment. The system 10 comprises a software defined filter 22 that is programmed to decompose a measured PV output power 18 into a high-frequency signal component 26 based substantially on cloud shading, and a low-frequency signal component 24 based substantially on movement of the sun.

The system 10 further comprises an open loop reactive power controller 28 configured to provide a reactive power compensation reference signal 20 that is a function of the high-frequency signal component 26, the low-frequency signal component 24, or a combination thereof, of the measured PV output power 18. The software defined filter 22 may be based on a state observer such as, for example, an extended Kalman Filter, and can be used to estimate one or both the low-frequency signal component 24 and the high-frequency signal component 26 of the PV output power 18.

According to one aspect, the reactive power compensation reference signal 20 provided by the open loop reactive power controller 28 may be based only on the high frequency variations. Thus, only the fast voltage variations would be compensated by a corresponding inverter 12 supplied reactive power. The remaining slow voltage variations will then be seen and dealt with only by the controllers associated with the OLTCs and voltage regulators, thus avoiding undesirable frequent operations of tap changers. The reactive power compensation reference signal 20 could be any function of one or both the low frequency signal component 24 and the high-frequency signal component 26 of the measured PV output power 18, such as, for example, a constant power factor function or a variable power factor function. The reactive power compensation reference signal 20 could also be, for example, the sum of a low frequency reactive power reference signal derived as a function of the low frequency signal component 24, and a high frequency reactive power reference signal derived as a function of the high frequency signal component 26.

The PV inverter 12 is configured to receive PV power 14 from a PV power source 16 and to generate PV output power 14 in response thereto. The PV inverter 12 is further configured to provide reactive power compensation in response to the reactive power compensation reference signal 20 that is a function of at least one of the high-frequency component 26 of the PV output power 14 caused substantially by cloud shading and the low-frequency component 24 of the PV output power 14 caused substantially by movement of the sun, as stated herein.

FIG. 2 is a graph 30 illustrating PV output power variations 18 and a low frequency component 24 derived by a state observer based PV filter, according to one embodiment. The low-frequency components 24 of the PV output power variations 18 can be represented at each point in time by a sine curve 25 with a certain amplitude and phase shift. In FIG. 2, the sine curves 25 for the estimated amplitude and phase shift at six different points in time (27) are shown. The low frequency component 24 consists of the values of the sine curves at the corresponding point in time and represents the slow variations caused substantially by the movement of the sun.

The software defined filter 22 according to one embodiment, is a mathematical filter that is capable of filtering the slow variation(s) out of the PV output power signals 14. The mathematical filter 22, according to one embodiment, may be based on a state observation method that utilizes a system model 32 that represents the slow variations of PV output power caused by the movement of the sun as the positive half of a sine curve 25. The state variables estimated by the software defined filter 22, according to one aspect, are the amplitude and phase shift of the sine curve 25. The different sine curves 25 shown in FIG. 2 are the sine curves corresponding to the amplitude and phase shift estimated by the filter 22 at six different points in time between sunrise and sunset. The known variable is the period or frequency of the sine curve 25, which is based on the knowledge of the sunrise and sunset times at the location of the PV power source 16. The mathematical filter 22 is particularly advantageous in that it can be used online, without the phase shifting limitations (i.e. time delay) generally introduced by low/fast pass filters, especially at the very low frequencies associated with the sine curve(s) 25.

In summary explanation, a method of online filtering of photovoltaic (PV) output signals 14 using a software defined filter 22, according to one embodiment, comprises first measuring PV output power 14 and generating signals 18 based on the measured PV output power 14. The generated signals 18 are decomposed via a software defined filter 22, such as, without limitation, a state observer, to continuously estimate a low-frequency component 24 of measured PV output power 18 based substantially on movement of the sun and a high-frequency component 26 of the measured PV output power 18 based substantially on cloud shading. A reactive power compensation reference signal 20, that may be a power factor according to one embodiment, is then generated as a function of at least one of the high-frequency component 26 of the PV inverter output power 14 and the low-frequency component 24 of the PV inverter output power 14. The resultant reactive power compensation reference signal 20 may then used as a control mechanism to control the amount of reactive power supplied by, for example, and without limitation, a corresponding PV inverter 12 that is responsive to the reactive power compensation reference signal 20

The software defined filter 22 may comprise a data processor such as, without limitation, a CPU or DSP and corresponding memory devices such as, for example, RAM, ROM, EEPROM, and HD/SSHD devices and associated interface devices, e.g. A/D and D/A devices, etc., allowing communication between the filter 22, the open loop reactive power controller 28, and without limitation, a corresponding PV inverter 12. The algorithmic/mathematical software is then stored in one or more of the corresponding memory device(s), allowing the software defined filter 22 to continuously estimate the high and low-frequency components 26, 24.

While the invention has been described in terms of various specific embodiments, those skilled in the art will recognize that the invention can be practiced with modification within the spirit and scope of the claims.

The invention claimed is:

1. A programmable filter for filtering of a photovoltaic (PV) output signal, wherein the filter is based on a system model defined by a positive portion of a sine curve representing a low-frequency signal component of a measured PV power signal that is based substantially on movement of the sun.

2. The programmable filter according to claim 1, wherein state variables of the system model defined by a positive portion of a sine curve representing the low-frequency signal component comprise an amplitude and a phase shift of the sine curve.

3. The programmable filter according to claim 1, wherein the sine curve has a period defined as 2*(sunset time-sunrise time).

4. The programmable filter according to claim 3, further comprising a summing element for generating a high-frequency signal component of the measured PV power signal, wherein the high-frequency signal component is based substantially on cloud shading, from the measured PV power signal and the derived low-frequency signal component.

5. The programmable filter according to claim 1, wherein the filter is based on a state observer for estimating state variables comprising an amplitude of the sine curve and a phase shift of the sine curve.

6. The programmable filter according to claim 1, wherein the filter is an online filter.

7. The programmable filter according to claim 1, wherein the programmable filter is a software defined mathematical filter.

8. The programmable filter according to claim 7, wherein the software defined mathematical filter comprises an extended Kalman filter.

9. The programmable filter according to claim 1, further comprising an open loop programmable reactive power controller configured to provide a reactive power compensation reference signal that is a function of at least one of a high-frequency signal component and the low-frequency signal component.

10. The programmable filter according to claim 9, wherein the reactive power compensation reference signal comprises at least one of a constant power factor signal, a variable power factor signal, or a combination thereof.

11. The programmable filter according to claim 9, wherein the reactive power compensation reference signal comprises a sum of a low-frequency reactive power reference signal derived as a function of the low-frequency signal component and a high-frequency reactive power reference signal derived as a function of the high-frequency signal component.

12. A method of online filtering of photovoltaic (PV) output signals, the method comprising:
    measuring a PV output power;
    generating PV output power signals in response to the measured PV output power;
    deriving via a programmable filter, a low-frequency signal component of the measured PV output power signals, wherein the low-frequency signal component that is based substantially on movement of the sun is represented by a system model defined by a positive portion of a sine curve; and
    generating via a summing element, a high-frequency signal component of the measured PV output power signals, wherein the high-frequency signal component is based substantially on cloud shading, from the measured PV output power signals and the derived low-frequency signal component.

13. The method of online filtering of PV output signals according to claim 12, wherein a period of the sine curve is defined as 2*(sunset time-sunrise time).

14. The method of online filtering of PV output signals according to claim 12, further comprising continuously estimating via a state observer, a value for each of a plurality of state variables of the system model based on the measured PV output signals.

15. The method of online filtering of PV output signals according to claim 14, wherein the plurality of state variables of the system model are defined by at least an amplitude of the sine curve and a phase shift of the sine curve.

* * * * *